SOLDERING DEVICE

Filed Sept. 30, 1957 2 Sheets-Sheet 1

INVENTOR
H. A. DVORAK
BY C. B. Hamilton
ATTORNEY

July 3, 1962 H. A. DVORAK 3,041,991

SOLDERING DEVICE

Filed Sept. 30, 1957 2 Sheets-Sheet 2

INVENTOR
H. A. DVORAK
BY C. B. Hamilton
ATTORNEY

United States Patent Office 3,041,991
Patented July 3, 1962

3,041,991

SOLDERING DEVICE

Howard A. Dvorak, Brookfield, Ill., assignor to Western Electric Company, Incorporated, New York, N.Y., a corporation of New York Filed Sept. 30, 1957, Ser. No. 687,040
1 Claim. (Cl. 113—126)

This invention relates to soldering devices and more particularly to devices for soldering lead wires of electrical components to printed wiring boards.

An object of this invention is to provide a device for soldering lead wires of electrical components to printed wiring boards.

Another object of this invention is to provide a device for soldering lead wires of electrical components to a printed wiring board wherein a mask supports the board and carries it over a fountain of molten solder.

With these and other objects in mind, the present invention contemplates a movable mask having a plurality of enlarged holes for receiving lead wires of electrical components extending through a printed wiring board. The mask is movable over a sheet-like solder fountain to solder the lead wires to the printed wiring board, the solder passing through the holes in the mask to impinge on the lead wires and printed wiring board.

Other objects and advantages of the invention will become apparent by reference to the following detailed description and the accompanying drawings illustrating a preferred embodiment of the invention, in which FIG. 1 is a plan view of a device embodying the principles of the invention showing a printed wiring board and its electrical components held in position on a movable mask;

Figure 1:
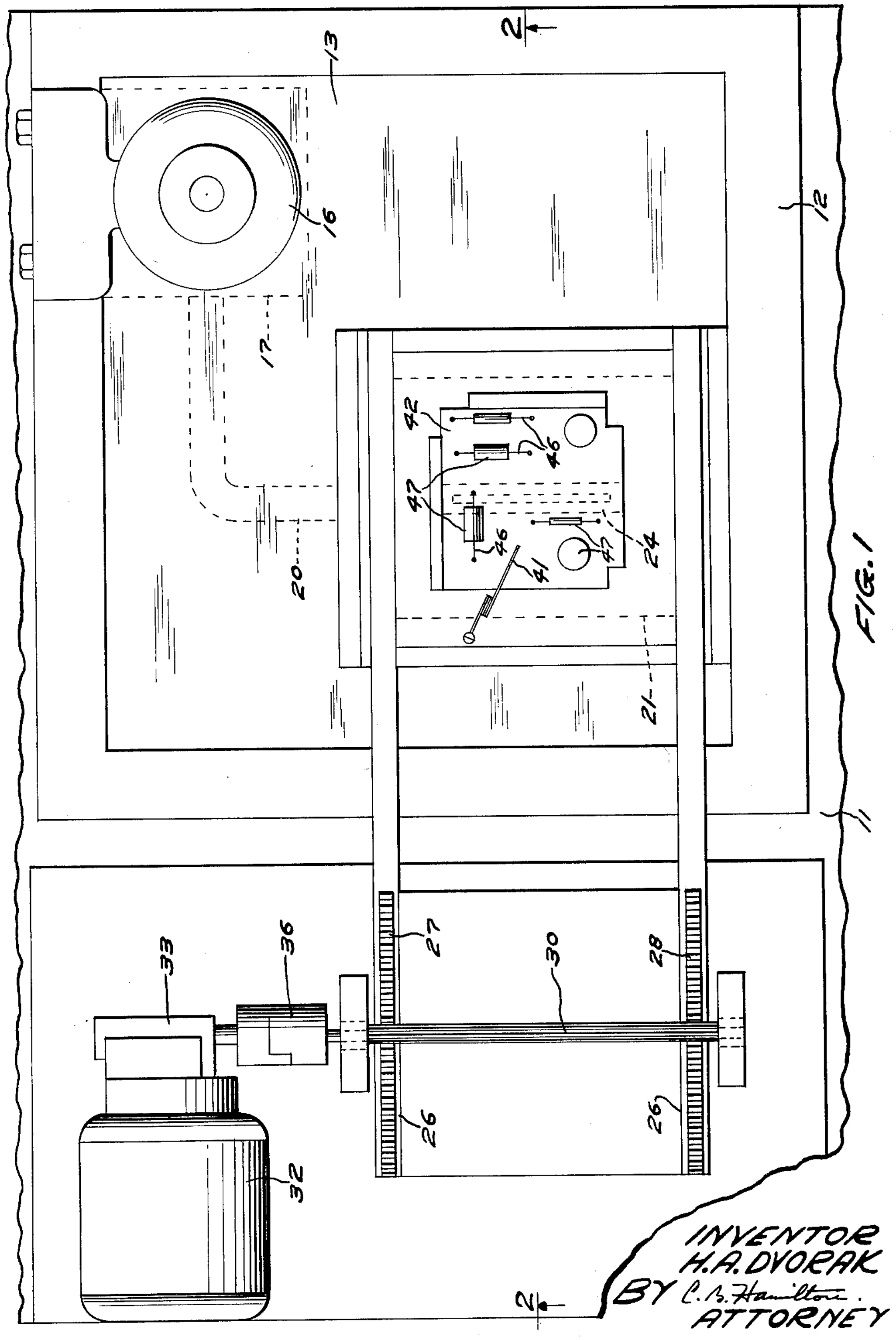

Referring now in detail to the drawings, there is shown a base 11 supporting a vat 12 containing molten solder 13. A motor 16 drives a pump 17 through a shaft 18 to force molten solder from the vat 12 through a tube 20 into a container 21 and out of the container through an elongated nozzle 24. The solder leaves the nozzle 24 in a vertical sheet-like fountain which extends the width of the nozzle which is equal to the width of a printed wiring board 42.

The base 11 also supports a frame 26 upon which is slidably mounted a pair of racks 27 and 28 meshed with a splined shaft 30 which is driven by a motor 32 through a gear system 33 and a coupling 36. The racks 27 and 28 are secured to a mask 40 which has a plurality of enlarged apertures 39 and which is slidably mounted above the nozzle 24. The mask 40 has secured thereto a spring clip 41 which has a free end for engaging the upper surface of a printed wiring board 42 for holding it on the mask 40. The mask 40 may be made of aluminum, of stainless or chrome plated steel, or of "Teflon" to which the solder does not adhere.

Figures 2, 3, 4:
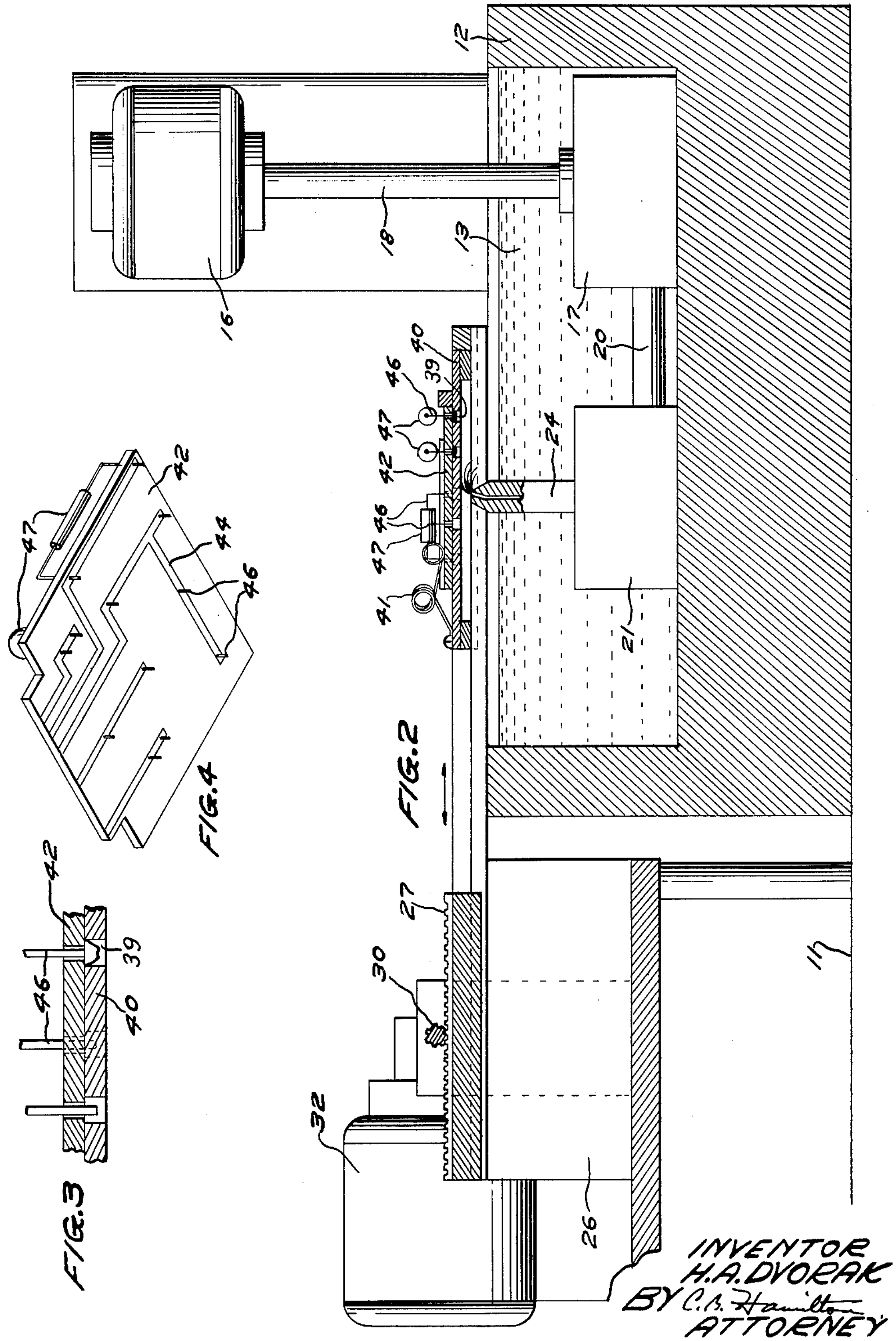
FIG. 2 is a sectional view taken on line 2—2 of FIG. 1 showing the manner in which a nozzle applies molten solder in a sheet-like fountain to the lead wires through apertures in the mask.
FIG. 3 is an enlarged fragmentary sectional view taken through the printed wiring board and the mask to illustrate lead wires before and after solder has been applied to them.
FIG. 4 is a perspective view of a printed wiring board having electrical components mounted thereon before the soldering operation.

The printed wiring board 42 is provided with a plurality of conductive paths 44 which are to be soldered to lead wires 46 of electrical components 47 mounted on the board 42. The lead wires 46 extend through holes in the board 42 and project slightly below the paths 44, as best depicted in FIGS. 3 and 4.

In operation of the device to solder lead wires of electrical components to printed wiring boards, a board 42 having components 47 mounted thereon is positioned on the mask 40 where it is held by the spring clip 41. The motor 16 is actuated to drive the pump 17 to force a sheet-like fountain of molten solder upward from the nozzle 24. The motor 32 is actuated to rotate the splined shaft 30 to move the racks 27 and 28 and the mask 40 past the nozzle 24. As the mask 40 moves past the nozzle 24, molten solder passes through the apertures 39 and strikes the projecting lead wires 46 and solders them to the conductive paths 44.

It is to be understood that the above-described arrangements are simply illustrative of the application of the principles of the invention. Numerous other arrangements may be readily devised by those skilled in the art which will embody the principles of the invention and fall within the spirit and scope thereof.

What is claimed is:

A soldering device comprising a base, a vat mounted on the base, a nozzle extending vertically from the vat and in communication with solder within the vat, the nozzle having a horizontally-disposed elongated orifice opening above the vat for attaining a vertical sheet-like fountain of solder above the surface of solder contained within the vat, a pump positioned within the vat and connected to the nozzle for forcing solder through the nozzle, a pair of horizontally-spaced elongated racks supported by the base and movable in a horizontal path above the orifice of the nozzle, rack teeth on the upper surface of the racks along one portion of their lengths, a splined shaft spanning the racks and meshed with the teeth of the racks, a motor connected to the shaft for horizontal lateral movement of the racks relative to and above the nozzle, a mask having a pattern of vertical apertures therethrough supported on the racks along another portion of their lengths and horizontally bridging the racks above the nozzle, the width of the mask being at least equal to the width of the elongated orifice of the nozzle, and a spring clip fixed to the upper surface of the mask having a free end for holding an article on the mask whereby the article undersurface exposed by apertures of the mask is solder coated as the racks move the article and mask laterally through the vertical sheet-like fountain.

References Cited in the file of this patent

UNITED STATES PATENTS

| | | |
|---|---|---|
| 316,896 | Hubel et al. | Apr. 28, 1885 |
| 1,783,642 | Ferguson et al. | Dec. 2, 1930 |
| 2,506,047 | Thomas | May 2, 1950 |
| 2,529,699 | Lach | Nov. 14, 1950 |
| 2,649,758 | Cowgill | Aug. 25, 1953 |
| 2,821,959 | Franz | Feb. 4, 1958 |
| 2,870,532 | Young | Jan. 27, 1959 |
| 2,877,731 | Allen | Mar. 17, 1959 |

FOREIGN PATENTS

| | | |
|---|---|---|
| 712,109 | Great Britain | July 21, 1954 |
| 200,151 | Australia | Nov. 9, 1955 |

OTHER REFERENCES

"New Advances in Printed Circuits," published by National Bureau of Standards, miscellaneous Publication 192, Nov. 22, 1948; page 60, column 2, relied on. (Copy in Scientific Library and in Division 14.)